United States Patent [19]
Lien

[11] Patent Number: 5,182,475
[45] Date of Patent: Jan. 26, 1993

[54] ECL TO CMOS VOLTAGE TRANSLATOR WITH BIPOLAR TRANSISTOR

[75] Inventor: Chuen-Der Lien, Mountain View, Calif.

[73] Assignee: Integrated Device Technology, Inc., Santa Clara, Calif.

[21] Appl. No.: 762,960

[22] Filed: Sep. 20, 1991

[51] Int. Cl.[5] .................................... H03K 19/0175
[52] U.S. Cl. ................................ 307/475; 307/499; 307/264
[58] Field of Search ............... 307/475, 499, 350, 530, 307/351, 264

[56] References Cited

U.S. PATENT DOCUMENTS 5,075,581 12/1991 Kamata ........................ 307/475
5,087,841 2/1992 Rogers ........................... 307/475

Primary Examiner—David Mis
Attorney, Agent, or Firm—Limbach & Limbach

[57] ABSTRACT

An improved circuit for translating ECL level voltages to CMOS level voltages. The circuit of the invention has a voltage gain stage with a bipolar transistor connected to a PMOS transistor, and a resistive loading stage including NMOS transistors. The bipolar transistor functions to increase the speed of the circuit (particularly at high temperatures) by increasing the driving capability of the voltage gain stage. The speed of the circuit will degrade very little at high temperature and high output load conditions, because the current driving capability of the bipolar transistor employed has low sensitivity to output loading and temperature.

14 Claims, 1 Drawing Sheet

CMOS VOLTAGE TRANSLATOR

ECL TO CMOS VOLTAGE TRANSLATOR WITH BIPOLAR TRANSISTOR

FIELD OF THE INVENTION

The invention relates to voltage translation circuits, and in particular to circuits for translating ECL level voltages to CMOS level voltages.

BACKGROUND OF THE INVENTION

In ECL BICMOS circuits, voltage translation circuitry is employed to translate ECL level voltages to CMOS level voltages. A conventional ECL level to CMOS level translation circuit is shown in FIG. 1. In the FIG. 1 circuit, PMOS field-effect transistors PM1 and PM2 function as a voltage gain stage, and NMOS field-effect transistors NM1 and NM2 function as a resistive loading stage for the voltage gain stage.

Throughout the specification, PMOS field-effect transistors will be referred to as "PMOS" transistors, and NMOS field-effect transistors will be referred to as "NMOS" transistors.

Normally, the difference $(V_{in}^+ - V_{in}^-) = U$ between the input voltages $V_{in}^+$ and $V_{in}^-$ asserted, respectively, at the gates of transistors PM1 and PM2, is substantially equal to $+1$ volt or $-1$ volt. In response to the input voltages $V_{in}^+$ and $V_{in}^-$, and an appropriate voltage $V_{cc}$, the FIG. 1 circuit can develop a CMOS level output voltage $V_{out}$, across output capacitor $C_{out}$, having magnitude in the range from about 0 volts to about $+5$ volts.

However, the CMOS voltage translator of FIG. 1 is very slow, particularly under conditions of high temperature and high output loading. This slowness is mainly due to the slow frequency response of the PMOS transistors at high temperature.

SUMMARY OF THE INVENTION

The invention is an improved circuit for translating ECL level voltages to CMOS level voltages. The inventive voltage translation circuit has a voltage gain stage with a bipolar transistor connected to a PMOS transistor, and a resistive loading stage including NMOS transistors. The bipolar transistor functions to increase the speed of the circuit (particularly at high temperatures) by increasing the driving capability of the voltage gain stage. The speed of the inventive circuit degrades very little at high temperature and high output load conditions, because the current driving capability of the bipolar transistor has low sensitivity to output loading and temperature.

DETAILED DESCRIPTION OF THE PREFERRED EMBODIMENT

Figure 1:
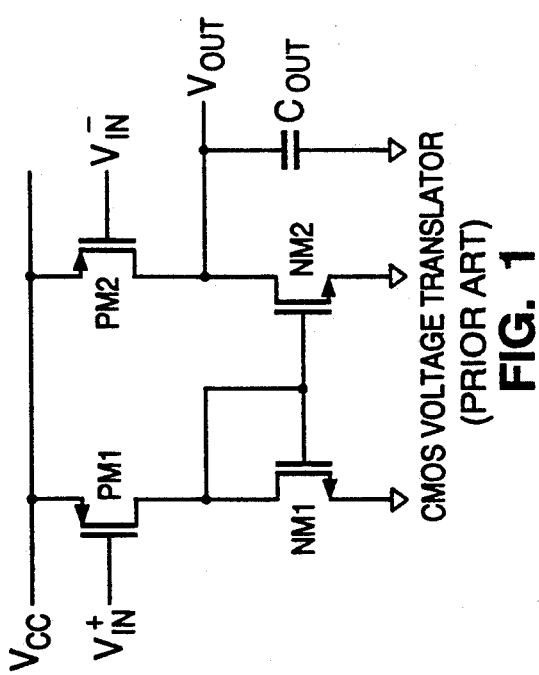
FIG. 1 is a circuit diagram of a conventional ECL to CMOS voltage translation circuit.

A first preferred embodiment of the inventive apparatus will be described with reference to FIG. 2. Both the circuit of FIG. 2 and the conventional circuit of FIG. 1 have a gain stage including PMOS transistors PM1 and PM2, and a resistive loading stage including NMOS transistors NM1 and NM2. The circuit of FIG. 2 differs from the conventional circuit of FIG. 1 by inclusion of bipolar transistor Q2 and resistor R2 in the gain stage.

The collector of transistor Q2 is connected to the common source of transistors PM1 and PM2, and the base of transistor Q2 is connected to the drain of transistor PM2. The emitter of transistor Q2 is connected to the drain of transistor NM2. Resistor R2 is connected between the base of transistor Q2 and the drain of transistor NM2. The sources of transistors NM1 and NM2 are connected to ground.

The components Q2 and R2 function in the following manner, to increase the driving capability of the voltage gain stage. When input voltage $V_{in}^-$ is low (and input voltage $V_{in}^+$ is high), transistor PM1 is off (i.e., substantially no current flows between its source and drain) and transistor PM2 is on (i.e., current flows through PM2). Since PM1 is off, transistors NM1 and NM2 are also off. The current flowing through resistor R2 develops sufficient voltage $V_{BE}$ across the base and emitter of npn transistor Q2 to turn on transistor Q2. As a result of the current flowing through Q2 (and the corresponding rapid accumulation of charge on capacitor $C_{out}$), the output voltage $V_{out}$ rapidly increases to the value $V_{cc} - V_{BE}$. The resistance R2 is chosen so that the current flowing through R2 is substantially lower than the current flowing in PM2. Typically the voltage $V_{BE}$ will be substantially equal to 0.8 volts when Q2 is on.

When input voltage $V_{in}^-$ goes high (and input voltage $V_{in}^+$ goes low), transistor pM2 is off (so that substantially no current flows between its source and drain) and transistor PM1 is on. The voltage passed through to the gate of each NM1 and NM2 by transistor PM1 is sufficient to turn on both transistors NM1 and NM2. As a result, output voltage $V_{out}$ rapidly decreases until it reaches the ground value. The residual current which flows through resistor R2 when transistor PM2 is off is insufficient to turn on transistor Q2.

Figure 2:
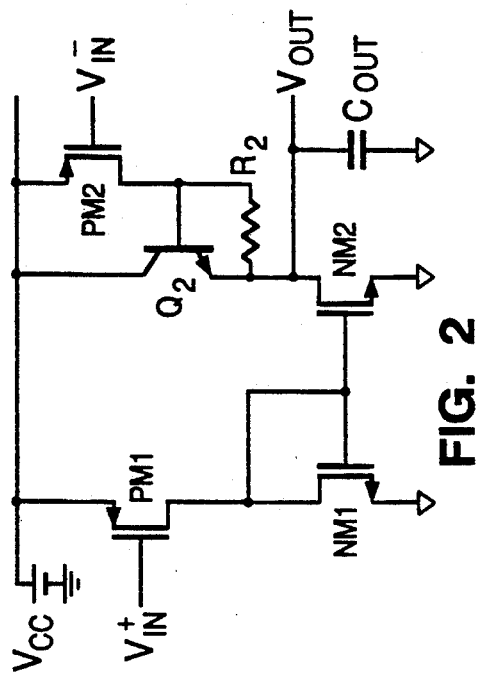
FIG. 2 is a circuit diagram of a preferred embodiment of the ECL to CMOS voltage translator of the invention.

In the case that output capacitor $C_{out}$ has capacitance 0.2 pF, the components of the FIG. 2 circuit will typically have the specifications indicated in Table 1:

TABLE 1

| Component | Specifications |
| --- | --- |
| PM1 | W = 15 u, L = 0.9 u |
| PM2 | W = 45 u, L = 0.9 u |
| NM1 | W = 10 u, L = 0.8 u |
| NM2 | W = 30 u, L = 0.8 u |
| Q2 | emitter size: 1 u × 3 u |
| R2 | 2000 ohms. |

A variation on the FIG. 2 circuit will next be described with reference to FIG. 3. The FIG. 3 circuit differs from that of FIG. 2 by inclusion of an additional npn bipolar transistor Q1 and resistor R1 in the gain stage. The collector of transistor Q1 is connected to the common source of transistors PM1 and PM2, and the base of transistor Q1 is connected to the drain of transistor PM1. The emitter of transistor Q1 is connected to the gate and drain of transistor NM1. Resistor R1 is connected between the base of transistor Q1 and the gate and drain of transistor NM1. The function of components Q1 and R1 is to further increase the driving capability of the voltage gain stage.

When input voltage $V_{in}-$ goes low (and input voltage $V_{in}+$ goes high), transistor PM1 turns off and the residual current which flows through resistor R1 is insufficient to turn on transistor Q1. Thus, under this condition, the FIG. 3 circuit functions in substantially the same manner as does the FIG. 2 circuit, to rapidly raise the output voltage $V_{out}$ to the value $V_{cc}-V_{BE}$, where $V_{BE}$ is the voltage between the base and emitter of Q2.

Figure 3:
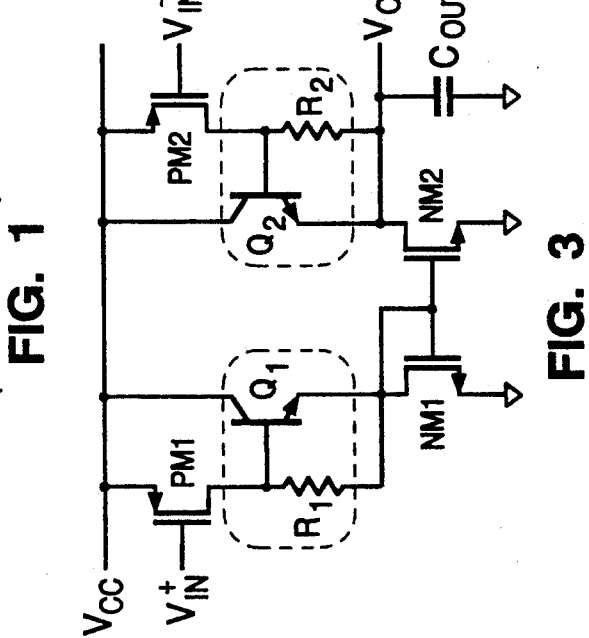
FIG. 3 is a circuit diagram of a second preferred embodiment of the ECL to CMOS voltage translator of the invention.

When input voltage $V_{in}-$ goes high (and input voltage $V_{in}+$ goes low) in the FIG. 3 circuit, transistor PM2 turns off (so that substantially all current cease to flow between its source and drain) and transistor PM1 turns on. The residual current flowing through resistor R2 is insufficient to turn on transistor Q2. The current flowing through resistor R1 develops sufficient voltage $V_{BE}$ across the base and emitter of transistor Q1 to turn on transistor Q1. As a result, the voltage passed through Q1 to the gate of each NM1 and NM2 rapidly increases to a level sufficient to turn on both transistors NM1 and NM2. Because NM1 and NM2 are turned on very rapidly, output voltage $V_{out}$ will decrease, even more rapidly than in the FIG. 2 embodiment, until it reaches ground.

A third embodiment of the invention will next be described with reference to FIG. 4. The FIG. 4 circuit differs from that of FIG. 3 by inclusion of an NMOS transistor NM3 connected in parallel with resistor R1 and an NMOS transistor NM4 connected in parallel with resistor R2 in the gain stage. The function of transistors NM3 and NM4 is to further increase the driving capability of the voltage gain stage.

Figure 4:
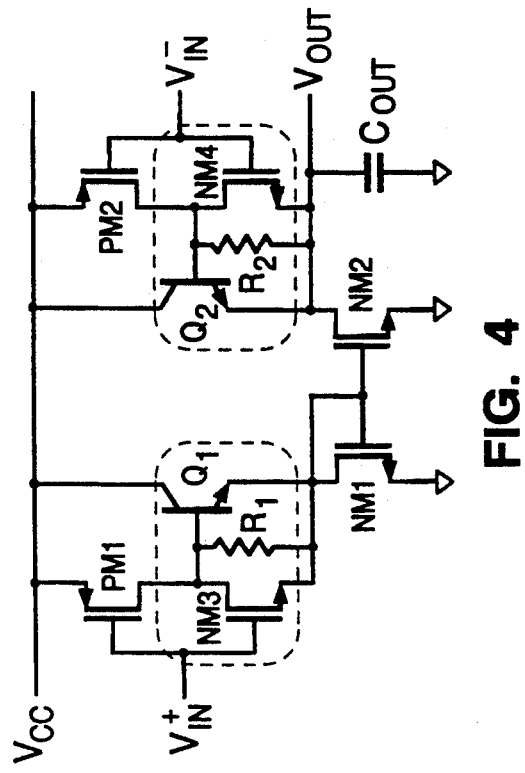
FIG. 4 is a circuit diagram of a third preferred embodiment of the ECL to CMOS voltage translator of the invention.

In FIG. 4, when input voltage $V_{in}-$ goes low (and input voltage $V_{in}+$ goes high), transistor PM1 turns off, the residual current flowing through resistor R1 is insufficient to turn on transistor Q1, transistor NM3 turns on, transistors PM2 and Q2 turn on, and transistor NM4 turns off. Thus, the effective combined resistance of parallel components NM3 and R1 is greater than that of R1 alone, causing NM1 and NM2 to turn off more rapidly than they would in the FIG. 3 embodiment (thereby increasing the speed at which current flowing through transistor Q2 increases the output voltage $V_{out}$ to the value $V_{cc}-V_{BE}$).

When input voltage $V_{in}-$ goes high (and input voltage $V_{in}+$ goes low) in the FIG. 4 circuit, transistors PM1 and Q1 turn on, transistor PM2 turns off, the residual current flowing through resistor R2 is insufficient to turn on transistor Q2, transistor NM4 turns on, transistor NM3 turns off, and transistors NM1 and NM2 turn on. Under this condition, the FIG. 4 circuit operates in substantially the same manner as the FIG. 3 circuit.

In the case that output capacitor $C_{out}$ has capacitance 0.2 pF, the circuit components of FIGS. 3 and 4 will typically have the specifications indicated in Table 2:

TABLE 2

| Component | Specifications |
| --- | --- |
| PM1 | W = 15 u, L = 0.9 u |
| PM2 | W = 45 u, L = 0.9 u |
| NM1 | W = 10 u, L = 0.8 u |
| NM2 | W = 30 u, L = 0.8 u |
| Q1 | emitter size: 1 u × 2 u |
| Q2 | emitter size: 1 u × 3 u |
| R1 | 6000 ohm |
| R2 | 2000 ohm |
| NM3 | W = 4 u, L = 0.8 u |
| NM4 | W = 12 u, L = 0.8 u |

Throughout the claims, the expression "non-gate terminal" is used with, reference to PMOS transistors, to denote either the source or drain (but not the gate) of a PMOS transistor.

Various modifications and alterations in the described method and apparatus of the invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. A circuit for translating ECL level voltages to CMOS level voltages, comprising:

gain stage circuitry including PMOS transistors having gates which receive ECL level voltage signals, and a bipolar transistor means connected to a first one of the PMOS transistors for increasing the speed at which the gain stage circuitry develops output signals in response to changes in the ECL level voltage signals;

resistive loading stage circuitry including NMOS transistors, each of said NMOS transistors including a gate, a source, and a drain, wherein the gates of the NMOS transistors are connected to a drain of a second one of the PMOS transistors, the drains of the NMOS transistors are connected to the gain stage circuitry for receiving said output signals, and the sources of the NMOS transistors are connected to ground; and an output terminal at which CMOS level voltage signals are developed in response to the ECL level voltage signals, wherein the output terminal is connected to the drain of a first one of the NMOS transistors and to the gain stage circuitry, wherein the bipolar transistor means includes a first bipolar transistor having a base connected to a non-gate terminal of the first one of the PMOS transistors and an emitter connected to the output terminal, and wherein the bipolar transistor means also includes a first resistor means connected between the base and the emitter of the first bipolar transistor.

2. The circuit of claim 1, wherein the resistor means consists of a first resistor connected between the base and the emitter of the first bipolar transistor.

3. The circuit of claim 1, wherein the resistor means includes a first resistor connected between the base and the emitter of the first bipolar transistor, and an NMOS transistor having a gate connected to the gate of the first one of the PMOS transistors and a source and a drain connected in parallel with the first resistor between the base and the emitter of the first bipolar transistor.

4. The circuit of claim 1, wherein the bipolar transistor means also includes a second bipolar transistor having a base connected to a non-gate terminal of the second one of the PMOS transistors and an emitter connected to the gates of the NMOS transistors.

5. The circuit of claim 4, wherein the bipolar transistor means also includes a resistor means connected between the base and the emitter of the second bipolar transistor.

6. The circuit of claim 5, wherein the resistor means consists of a resistor connected between the base and the emitter of the second bipolar transistor.

7. The circuit of claim 5, wherein the resistor means includes a resistor connected between the base and the emitter of the second bipolar transistor, and an NMOS transistor having a gate connected to the gate of the second one of the PMOS transistors and a source and a drain connected in parallel with the resistor between the base and the emitter of the second bipolar transistor.

8. The circuit of claim 1, also including a capacitor connected between the output terminal and ground.

9. A circuit for translating ECL level voltages to CMOS level voltages, comprising:
   gain stage circuitry including PMOS transistors having gates which receive ECL level voltage signals, and a bipolar transistor means connected to a first one of the PMOS transistors for increasing the speed at which the gain stage circuitry develops output signals in response to changes in the ECL level voltage signals;
   resistive loading stage circuitry including NMOS transistors, each of said NMOS transistors including a gate, a source, and a drain, wherein the gates of the NMOS transistors are connected to a drain of a second one of the PMOS transistors, the drains of the NMOS transistors are connected to the gain stage circuitry for receiving said output signals, and the sources of the NMOS transistors are connected to ground; and
   an output terminal at which CMOS level voltage signals are developed in response to the ECL level voltage signals, wherein the output terminal is connected to the drain of a first one of the NMOS transistors and to the gain stage circuitry, wherein the bipolar transistor means includes a bipolar transistor having a base connected to a non-gate terminal of the second one of the PMOS transistors and an emitter connected to the gates of the NMOS transistors, and wherein the bipolar transistor means also includes a resistor means connected between the base and the emitter of the bipolar transistor.

10. The circuit of claim 9, wherein the resistor means consists of a resistor connected between the base and the emitter of the bipolar transistor.

11. The circuit of claim 9, wherein the resistor means includes a resistor connected between the base and the emitter of the bipolar transistor, and an NMOS transistor having a gate connected to the gate of the second one of the PMOS transistors and a source and a drain connected in parallel with the resistor between the base and the emitter of the bipolar transistor.

12. A circuit for translating ECL level voltages to CMOS level voltages, comprising:
   a resistive loading stage including a first NMOS transistor and a second NMOS transistor, each of the NMOS transistors having a gate, a source, and a drain;
   a gain stage including a first PMOS transistor, a second PMOS transistor, and a bipolar transistor, wherein each of the PMOS transistors has a gate which receives an ECL level voltage signal;
   an output terminal which asserts CMOS level voltage signals in response to the ECL level voltage signals, said output terminal being connected to a non-gate terminal of the first NMOS transistor, wherein the bipolar transistor has a base connected to a non-gate terminal of the first PMOS transistor; and
   a first resistor means connected between an emitter of the bipolar transistor and the output terminal, wherein the bipolar transistor passes current through the first resistor means to the output terminal in response to a first set of ECL level voltage signals, thereby rapidly developing a first CMOS level voltage at the output terminal.

13. The circuit of claim 12, wherein the gates of the first and the second NMOS transistors and the drain of the second NMOS transistor are connected to a non-gate terminal of the second PMOS transistor, the drain of the first NMOS transistor is connected to the output terminal, and the sources of the NMOS transistors are connected to ground.

14. The circuit of claim 12, also including a second bipolar transistor having a base connected to a non-gate terminal of the second PMOS transistor and an emitter connected to the gates of the NMOS transistors.

* * * * *